United States Patent
Alcoe et al.

(10) Patent No.: US 7,015,574 B2
(45) Date of Patent: Mar. 21, 2006

(54) ELECTRONIC DEVICE CARRIER ADAPTED FOR TRANSMITTING HIGH FREQUENCY SIGNALS

(75) Inventors: David Alcoe, Vestal, NY (US); Ronald Nowak, Vestal, NY (US); Francesco Preda, Mozzo (IT); Stefano Sergio Oggioni, Milan (IT)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 10/495,674

(22) PCT Filed: Oct. 25, 2002

(86) PCT No.: PCT/EP02/13209

§ 371 (c)(1),
(2), (4) Date: May 13, 2004

(87) PCT Pub. No.: WO03/043085

PCT Pub. Date: May 22, 2003

(65) Prior Publication Data

US 2005/0006137 A1  Jan. 13, 2005

(30) Foreign Application Priority Data

Nov. 13, 2001 (EP) .......................................... 01480110

(51) Int. Cl.
*H01L 23/48* (2006.01)

(52) U.S. Cl. ...................................... 257/690; 257/691
(58) Field of Classification Search ................ 174/250, 174/251, 252, 253, 254, 255, 256, 257, 258, 174/259, 260, 261, 262, 263, 264, 265, 266, 174/267, 268; 257/678, 690, 691; 361/600, 361/679, 748, 752, 767
See application file for complete search history.

(56) References Cited

U.S. PATENT DOCUMENTS 5,336,855 A   8/1994  Kahlert et al.
5,691,568 A  11/1997  Chou et al.

FOREIGN PATENT DOCUMENTS

| EP | 0834922  | 4/1998  |
|----|----------|---------|
| JP | 06260773 | 9/1994  |
| JP | 11-8445  | * 1/1999 |

* cited by examiner

Primary Examiner—Nathan J. Flynn
Assistant Examiner—Kevin Quinto
(74) Attorney, Agent, or Firm—Richard M. Kotulak

(57) ABSTRACT

An electronic device carrier (110) adapted for transmitting high-frequency signals, including a circuitized substrate with a plurality of conductive layers (240a to 240g) insulated from each other, the conductive layers being arranged in a sequence from a first one of the conductive layers (240a) wherein a plurality of signal tracks (200) each one ending with a contact area (205) for transmitting a high-frequency signal are formed, and a reference structure (215a, 215b, 230) connectable to a reference voltage or ground for shielding the signal tracks the reference structure includes at least one reference track (230) formed in a second one of the conductive layers (240b) adjacent to the first conductive layer and at least one further reference track formed in one of the conductive layers (240d) different from the first and second conductive layer, a portion of each signal track excluding at least the area corresponding to the orthographic projection of associated contact area being superimposed in plan view to a corresponding reference track and at least a part of the area corresponding to the orthographic projection of the contact area associated to each signal track being superimposed in plan view to a corresponding further reference track with interposition of a floating conductive track, i.e. a track not connected to any signal, reference voltage or ground track.

19 Claims, 3 Drawing Sheets

ELECTRONIC DEVICE CARRIER ADAPTED FOR TRANSMITTING HIGH FREQUENCY SIGNALS

FIELD OF THE INVENTION

The present invention relates to the field of electronic device interconnection and more specifically to an electronic device carrier adapted for transmitting high frequency signals.

BACKGROUND OF THE INVENTION

Several types of electronic components are implemented with a circuit, which is integrated in a chip of semiconductor material. The chip is typically mounted on a carrier, so as to protect the chip from mechanical stresses, and is then encapsulated in a package. The chip carrier includes an insulating substrate with conductive tracks; each track is bonded to a corresponding terminal of the chip, and ends with a contact pad, typically for connection to a printed circuit board. Likewise, printed circuit board generally comprises several conductive layers formed in an insulating material, adapted to transmit signals between several electronic devices or between electronic devices and connectors.

When switching speeds of devices goes above 1 GHz clock rate, there is a need to no longer consider electrical signal transmission as a simple point to point transmission on a track but rather as the propagation of an electromagnetic wave supported by a current on a circuit trace. Such traces on electronic device carriers (chip carriers and printed circuit boards), also called transmission lines, represent a system comprising at least two conductive paths with specific properties (relation between transmission line width, distances between transmission lines, dielectric thickness between transmission lines and reference planes). These transmission lines comprise a conductive signal track or trace and another track and/or conductive plane, formed in close proximity and connected to a reference voltage or ground, for shielding the signal track from electromagnetic interference. The wave propagates along a transmission line defined by the signal track and an underlying reference voltage or ground plane, forming a complete loop path for the signal current. When the chip works at a high frequency, e.g. more than 1 GHz, the influence of the electronic device carrier may severely affects the performance of the electronic system as a whole.

Particularly, any discontinuity (or transition) in the transmission line, such as any change in structure, material properties and design features, generates a reflected wave. Moreover, the system includes stray structures (capacitors, inductors and resistors), which act as low pass filters for the transmitted signal. As a consequence, the integrity of the electromagnetic wave propagated along the transmission line is not preserved.

The transmitted signal, switching between a low voltage (logic value 0) and a high voltage (logic value 1), generates a square-shaped wave. Due to all discontinuities in the transmission line, this wave undergoes degradation and is generally received as a pseudo-sinusoidal wave. The quality of the transmitted wave can be visualized by a so-called "eye diagram", which plots the value of the received signal as a function of the phase of a clock signal controlling the electronic device. The above described discontinuities in the transmission line reduce the opening of the eye diagram; therefore, it is quite difficult to understand if a switching transition has actually taken place or if the shift of a signal baseline is due to a background noise.

These drawbacks are particular acute in modern electronic systems working with a reduced level of a power supply voltage (down to 1.2 V). In this case, there is a very low margin to discriminate between the logic value 0 (0V) and the logic value 1 (1.2V).

Moreover, the continuous trend towards miniaturization of electronic devices requires a reduction in the dimensions of chip carrier and printed circuit board conductive tracks. However, the impedance of the transmission line must be maintained at a desired value which optimizes the performance of the electronic device (typically 50Ω). Therefore, it is necessary to use a very thin dielectric layer between the conductive tracks and the ground plane (since the impedance is inversely proportional to the track width and directly proportional to the dielectric layer thickness). The short distance between the conductive tracks and the ground plane increases the value of a corresponding stray capacitance; as a consequence, the bandwidth of the transmission line is strongly reduced.

Therefore, as the quality of the transmission in the electronic device carrier, i.e. chip carrier or printed circuit board, is degraded it can cause the electronic device to operate at a frequency far lower than the working frequency which is afforded by the chip.

SUMMARY OF THE INVENTION

Thus, it is a broad object of the invention to provide an electronic device carrier to remedy the shortcomings of the prior art as described here above.

It is an object of the invention to provide a reliable electronic device carrier adapted for transmitting high frequency signals.

It is another object of the invention to provide an electronic device carrier adapted for transmitting high frequency signals that matches coefficient expansion of electronic device and electronic system on which it is connected.

It is still another object of the invention to provide a flatness electronic device carrier adapted for transmitting high frequency signals.

It is still another object of the invention to provide an electronic device carrier adapted for transmitting high frequency signals that improve pads coplanarity so as to provide reliable contacts between pads and electronic device I/O.

It is a further object of the invention to provide an electronic device carrier adapted for transmitting high frequency signals that provide reliable adhesion between its different dielectric material layers.

The accomplishment of these and other related objects is achieved by an electronic device carrier adapted for transmitting high-frequency signal, including a circuitized substrate with a plurality of conductive layers insulated from each other, the conductive layers being arranged in a sequence from a first one of the conductive layers wherein a plurality of signal tracks each one ending with a contact area for transmitting a high-frequency signal are formed, and a reference structure connectable to a reference voltage or ground for shielding the signal tracks, characterized in that
the reference structure includes at least one reference track formed in a second one of the conductive layers adjacent to the first conductive layer and at least one further reference track formed in one of the conductive layers different from the first and second conductive layer, a portion of each signal track excluding at least the area corresponding to the orthographic projection of associated contact area being superimposed in plan view to a corresponding reference track and at least a part of the area corresponding to the orthographic projection of contact area associated to each signal track being superimposed in plan view to a corresponding further reference track with interposition of a floating conductive track not connected to any signal, reference voltage or ground track.

Further advantages of the present invention will become apparent to the ones skilled in the art upon examination of the drawings and detailed description. It is intended that any additional advantages be incorporated herein.

BRIEF DESCRIPTION OF THE DRAWINGS

FIG. 2 comprising FIGS. 2a and 2b illustrate in plan view and in cross-section, respectively, while FIG. 2c is a plan view of a specific conductive layer.

DETAILED DESCRIPTION OF THE PREFERRED EMBODIMENT

For sake of illustration, the following description is based on Ball Grid Array (BGA) package wherein chip to chip carrier interconnection is performed with Controlled Collapse Chip Connection (IBM C4 technology), widely known as Flip-Chip Attach (FCA). Such technology provides high I/O density, uniform chip power distribution, high cooling capability and high reliability.

Figure 1:
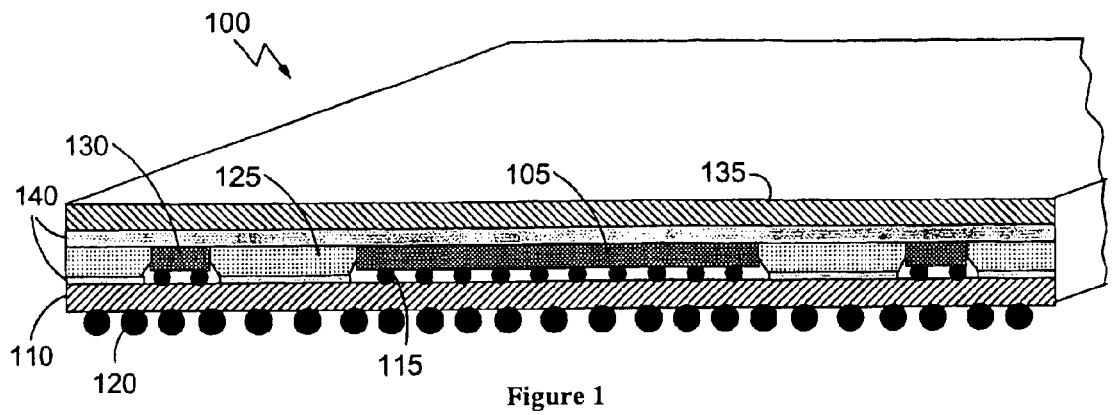
FIG. 1 shows a cross-section view of an electronic module in which a chip carrier according to the invention can be used.

With reference in particular to FIG. 1, there is depicted an electronic module 100 of the BGA type. The electronic module 100 includes a chip 105 of semiconductor material, wherein a power circuit working at a high frequency, e.g. with a clock rate of 5 GHz, is integrated. Chip 105, supplied by a low voltage power supply, e.g. 1.2V., is mounted on a laminate chip carrier 110 comprising several conductive layers, e.g. made of copper, insulated from each other by means of a dielectric material, e.g. Polytetraflouroethylene (PTFE). Chip 105 to chip carrier 110 interconnection is performed with C4 balls 115 while chip carrier 110 to printed circuit board (not represented) interconnection is done with BGA balls 120. Chip carrier 110 is glued to stiffener 125 that comprises cavities for chip 105 and, optionally, other electronic components such as capacitor 130. Stiffener 125 consists preferably of a metallic plate, e.g. made of copper, which increases the rigidity of the entire electronic module 100 and provides further path to dissipate thermal energy produced by chip 105. Chip 105 and stiffener 125 are covered by lid 135, e.g. made of copper, which also acts as a heat-spreader for dissipating the heat produced by chip 105 as well as providing mechanical protection for chip 105. Layers 140 comprise glue, e.g. epoxy glue, that fixed together chip carrier 110, chip 105, stiffener 125 and lid 135. Glue also compensates for the different coefficients of thermal expansion of chip carrier 110, chip 105, stiffener 125 and lid 135.

Likewise considerations apply if the electronic device is not of the BGA type, if the chip does not embody a (digital) power circuit, if it works at a different frequency or with a different power supply, and so on.

Figure 2A:
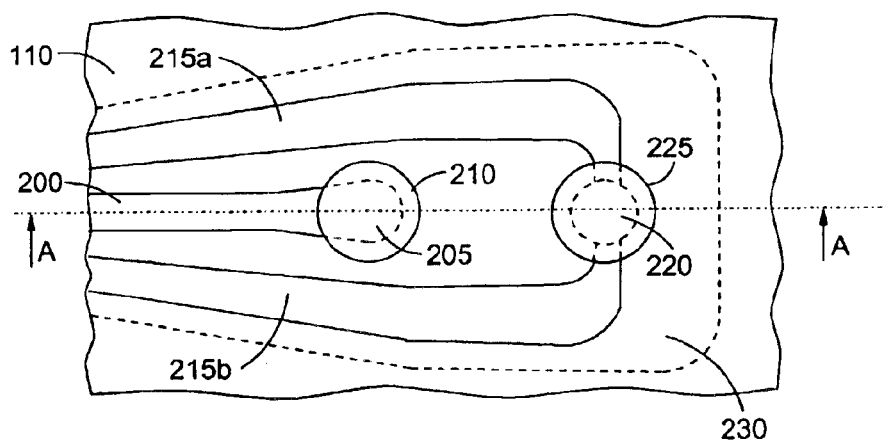
FIGS. 2a, 2b and 2c, depicts a particular chip carrier according to the invention.

Considering now FIG. 2a illustrating a partial plan view of chip carrier 110, there is shown a track, referred to as 200, ending with a pad 205, which may be connected to interconnecting ball 210, with a through via, which is used for transmitting a high-frequency signal. A couple of coplanar tracks, referred to as 215a and 215b respectively, are arranged around signal track 200 and may be formed in the same conductive layer as illustrated. Coplanar tracks 215a and 215b end with pad 220 for interconnecting ball 225 which is linked to track 230, formed in another conductive layer, and to a reference voltage or ground track formed in printed circuit board (not represented). Track 230 is partially superimposed to track 200 and coplanar tracks 215a and 215b.

The high-frequency signal transmitted on track 200 generates an electromagnetic wave which propagates along a transmission line defined by signal track 200, coplanar tracks 215a and 215b and track 230.

Figure 2C:
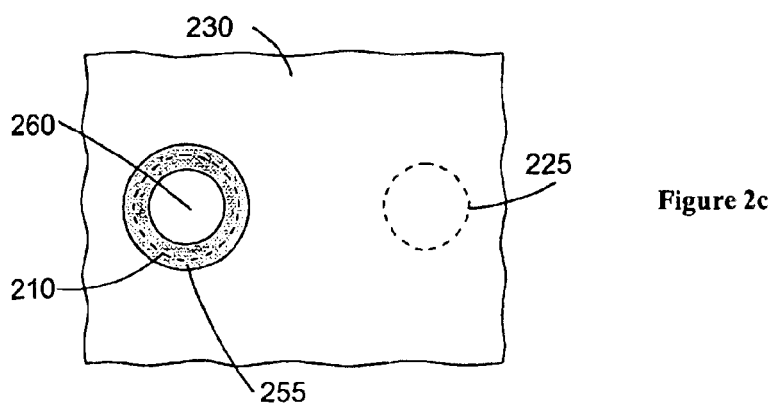
Figure 2B:
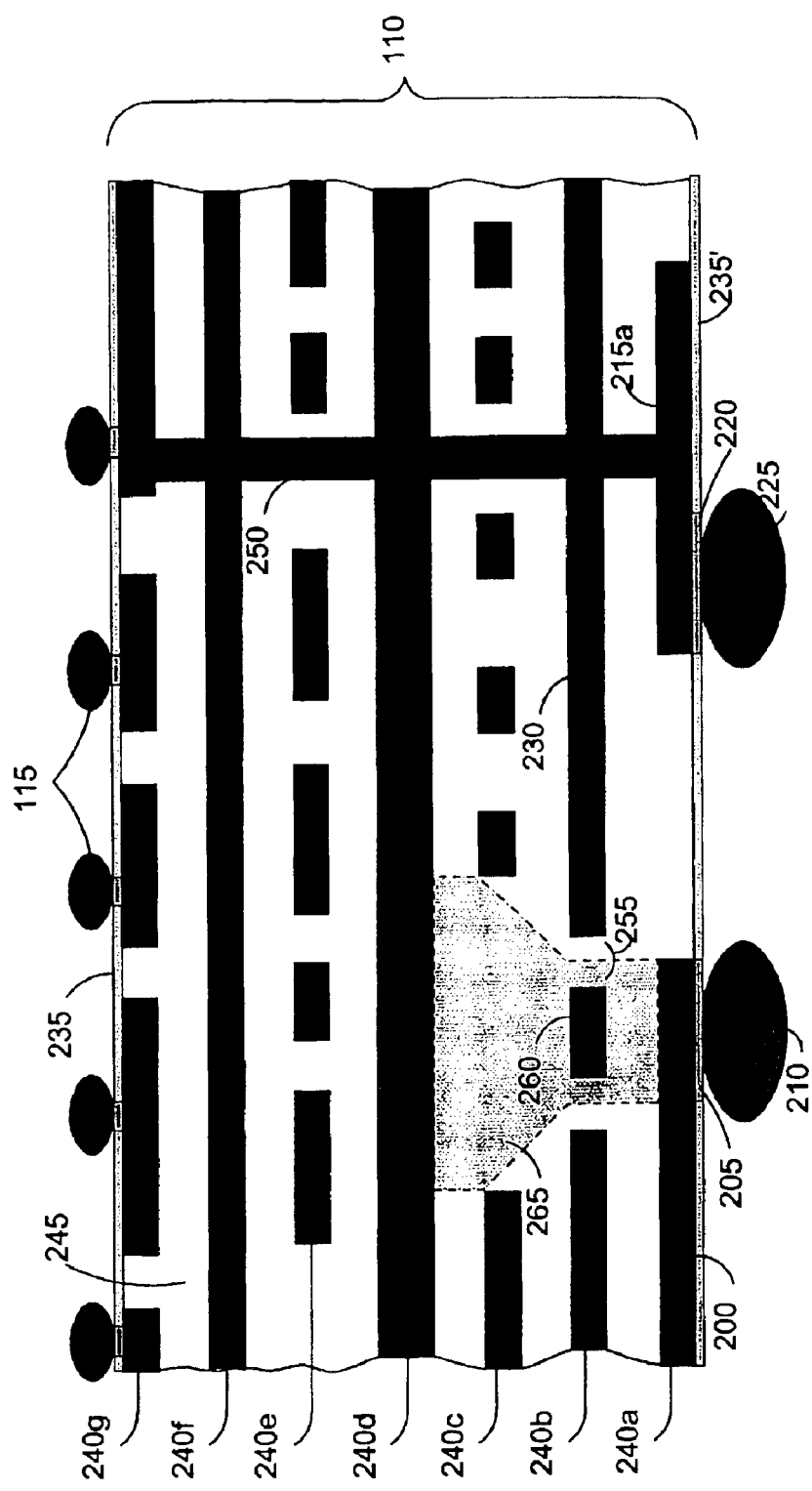

Considering now the cross-section along line A—A, as shown on FIG. 2b, chip carrier 110 is insulated from chip 105 (not represented) and printed circuit board (not represented) by means of insulating films 235 and 235', respectively. Insulating films 235 and 235' comprise openings wherein pads, e.g. pad 205, are formed. Chip carrier 110 comprises several conductive layers 240a to 240g (seven in the example at issue), that are insulated from each other by means of a dielectric material 245, e.g. PTFE. Conductive layers 240a to 240g provide electrical connection between chip 105 and the printed circuit board (not represented) on which electronic module 100 is soldered. Generally speaking, design of tracks in conductive layers 240a to 240g is optimized so as to reduce cross-talk between signals and transmission delays. As a consequence, conductive layers 240b, 240d and 240f are often used to form reference voltage or ground tracks, conductive layers 240c and 240e are used to transmit (high frequency) signals and conductive layers 240a and 240g are used to connect ball pads to internal conductive layers 240b to 240f and thus are used to form either (high frequency) signal tracks or reference voltage or ground tracks.

Thus, as an illustration, signal track 200 and coplanar tracks 215a and 215b are formed in the first conductive layer 240a (starting from the lower surface of the chip carrier 110) and track 230 is formed in the second conductive layer 240b (adjacent to the first conductive layer).

A via-hole 250 connects the reference voltage or ground plane formed in conductive layer 240d to track 230 and coplanar tracks 215a and 215b, and then to interconnecting ball 225.

The reference voltage or ground planes formed in conductive layer 240d, track 230 and coplanar tracks 215a and 215b define a reference structure which controls the impedance of a transmission line associated with the signal track 200 and shields the signal track 200 from electromagnetic interference.

Proximity of conductive layers produces stray capacitors. In particular, stray capacitors are formed between interconnecting balls 210 and 225 and between interconnecting ball 210 and tracks formed in conductive layer 240b.

The inventors have discovered that the degradation of the performance of the known electronic devices is mainly due to a discontinuity in the transmission line associated with the interconnecting ball 210. The transmission line is actually subjected to a sharp change of direction, from an horizontal direction along the signal track 200 to a vertical direction going up to the interconnecting ball 210. Particularly, the stray capacitor formed between interconnecting ball 210 and tracks formed in conductive layer 240b has a relative high capacitance if compared to the one formed between interconnecting balls 210 and 225. As a result, these capacitors are acting at high frequency as a low pass filter and therefore reducing the transmission bandwidth. The stray capacitor formed between interconnecting ball 210 and tracks formed in conductive layer 240b may be reduced by implementing openings in conductive layers 240b and 240c according to the orthographic projection of contact areas corresponding to pads, e.g. pad 205, i.e. by excluding any signal or reference voltage tracks. However, these openings may lead to manufacturing drawbacks, e.g. flatness of chip carrier 110, since conductive layer thickness, e.g. 12 µm, of package structure can not be disregarded when considering dielectric layer thickness, e.g. 35 µm. It becomes evident how difficult could be to replenish the large areas created by removing conductive material, e.g. 600 to 800 µm in diameter, in layer 240b, to maintain flatness across the whole package surface area. A further manufacturing drawback is the extended dielectric material to dielectric material interface that is a very critical adhesion interface for such large areas. Thus, the invention is going in the opposite direction of aforementioned approach, it consists in implementing annular ring openings, e.g. 255, wherein central floating disks, e.g. 260, made of conductive material, that are not connected to any signal, reference voltage or ground planes, as illustrated on FIGS. 2b and 2c.

Shape 265 represents the location in which no signal, reference voltage or ground plane has to be formed so as to reduce low pass filter effects mentioned above. Shape 265 is formed by superposing conical and cylindrical parts having a common axis, perpendicular to conductive layer 240a. A first cylindrical part is delimited by first and second conductive layers 240a and 240b wherein signal and reference voltage or ground tracks are formed, respectively. The conical part is delimited by second and third conductive layers 240b and 240c wherein reference voltage or ground tracks and signal are formed, respectively. A second cylindrical part is delimited by third conductive layer 240c wherein signal tracks are formed and the closest conductive layer 240d wherein further reference voltage or ground tracks are formed. The smaller diameter of conical part corresponds to the diameter of first cylindrical part and the diameter of the second cylindrical part corresponds to the greater diameter of the conical part, as illustrated. Diameter of first cylindrical part is determined by contact area corresponding to pad 205, its value is at least equal to orthographic projection of this contact area corresponding to pad 205. Conical part angle is comprised between 30° and 60° and is preferably equal to 45°, as shown. A floating disk 260, made of conductive material, is formed in conductive layer 240b to create annular ring 255, made of insulating material, between reference plane 230 and floating disk 260 as illustrated on FIGS. 2b and 2c. In a preferred embodiment, cross-section of annular ring 255 is centred on orthographic projection of contact area corresponding to pad 205. Floating disk 260 is not connected to any signal, reference voltage or ground track. For example, considering contact area corresponding to pad 205 having a diameter equal to 600 µm, the diameter of the openings must be at least equal to 600 µm however, a greater diameter improves signal shielding. Inventors have observed that, in such cases, opening diameter equals to 800 µm and floating disk diameter equals to 600 µm are values that provide an efficient signal shielding while optimizing dedicated surface area and physical parameters mentioned above, e.g. flatness across the whole package surface area and dielectric material to dielectric material adhesion.

Likewise considerations apply if the chip carrier has a different structure, for example with two differential signal tracks arranged between the coplanar tracks, if the chip carrier includes a different number of conductive layers, if a further ground plane is provided on top of the first layer wherein the signal tracks are formed, if the ground planes and the power plane consists each of two or more distinct tracks, if the contact area has a different dimension, and so on.

More generally, the present invention provides an electronic device carrier for transmitting high-frequency signals, including a circuitised substrate with a plurality of conductive layers insulated from each other; the conductive layers are arranged in a sequence from a first one of the conductive layers wherein a plurality of signal tracks are formed, each one ending with a contact area for transmitting a high-frequency signal. The electronic device carrier further includes a reference structure connectable to a reference voltage or ground for shielding the signal tracks; the reference structure has at least one reference track formed in a second one of the conductive layers adjacent to the first conductive layer and at least one further reference track formed in one of the conductive layers different from the first and second conductive layer; a portion of each signal track excluding at least the area corresponding to the orthographic projection of associated contact area, i.e. pad, is superimposed in plan view to a corresponding reference track, and at least a part of the area corresponding to the orthographic projection of contact area, i.e. pad, associated to each signal track, is superimposed in plan view to a corresponding further reference track with interposition of a floating conductive track not connected to any signal, reference voltage or ground track.

The devised solution strongly reduces the capacitance of the stray capacitor formed between the signal track and the reference plane in the area of the interconnecting ball (being inversely proportional to their distance).

The solution of the invention maintains a good integrity of the electromagnetic wave propagated along the transmission line. The proposed design of the electronic device carrier affects the performance of the chip as little as possible, so that the whole electronic system can be operated at a frequency very close to the working frequency which is afforded by the chip.

Moreover, the solution according to the invention maintains the bandwidth of the transmission line at a satisfactory value, even if the dimensions of the signal track (and then also the width of the dielectric layer between the signal track and the adjacent reference plane) are reduced. Therefore, this structure makes it possible to produce electronic system of very small dimensions, but at the same time with a high performance.

Considering manufacturing and mechanical aspects, the solution of the invention is adapted for flatness electronic device carrier for transmitting high frequency signals and allows to match coefficient expansion between electronic device carrier, electronic device and electronic system on which it is connected since contact areas of adjacent dielectric material layers are minimized with an improved adhesion between layers in the electronic device carrier multi-layer structure.

Figure 3A:
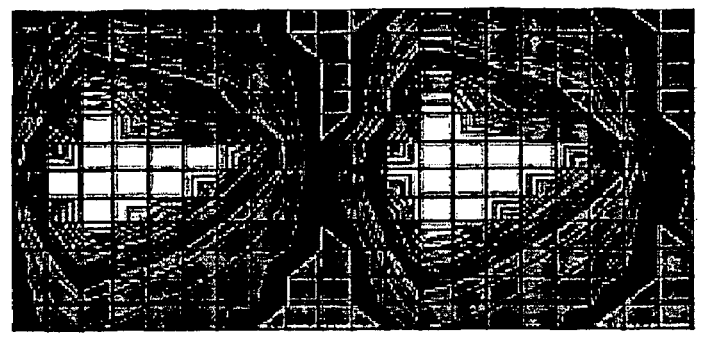
FIG. 3 comprising 3a and 3b, is an eye-diagram of a signal in a known electronic device and in an electronic device including the chip carrier according to the invention, respectively.
Figure 3B:
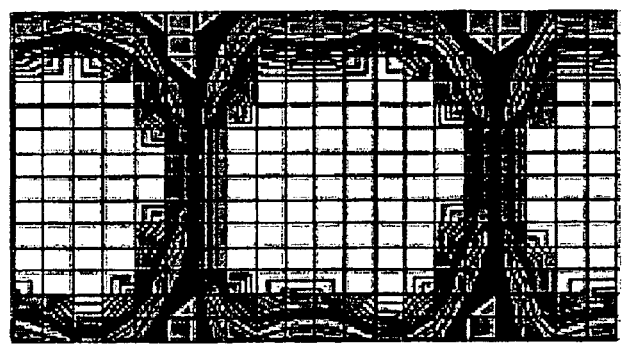

With reference in particular to FIG. 3a, there is depicted an eye-diagram for a known electronic module, with a single reference plane adjacent to the signal track, which also overlaps the respective interconnecting ball. This diagram shows the value (in V) of a signal s(t) received from a transmission line as a function of the phase of a clock signal; the eye-diagram is quite close, due to the discontinuities in the transmission line. Conversely, an eye-diagram for the electronic module embedding the chip carrier of the invention, as shown in FIG. 3b, is more open, so that it is easier to discriminate an actual switching transition of the signal from a shift of a signal baseline due to a background noise. As a consequence, the electronic module can be operated at a high-frequency even with a reduced level of the power supply voltage.

Figure 4A:
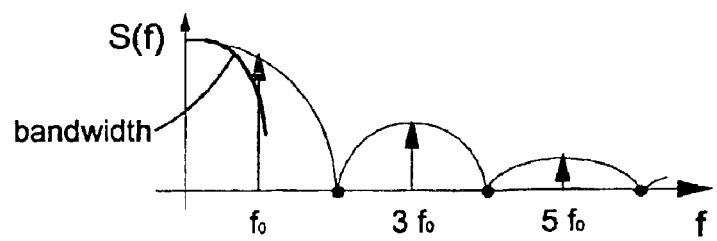
FIG. 4 comprising 4a and 4b, shows the same signals in the frequency domain.
Figure 4B:
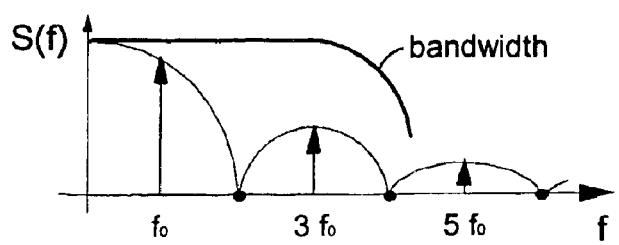

In other words, in the known electronic module the low-pass filter defined by the stray capacitor formed between the pad and the underlying reference plane has a very low cut-off frequency; therefore, as shown in FIG. 4a, only the first harmonic $f_0$ of the signal s(f) (expressed in the frequency domain) is hardly transmitted. On the other hand, the solution of the invention increases the bandwidth of the transmission line up to the third harmonic $3f_0$ of the signal, as shown in FIG. 4b.

While the invention has been described by reference to chip carriers for transmitting high frequency signals from the chip carrier to a printed circuit board, the invention may be efficiently applied in the chip carrier to reduce effects of discontinuity in the transmission lines close to C4 pad or pad used for wire bonded connection.

Stray capacitor effects in printed circuit boards are generally negligible since the ratio of dielectric layer thickness between signal, reference voltage and ground tracks and track width is often great enough. Thus, there is generally no need to implement the invention in printed circuit boards, even if it could be done without drawback, except regarding costs. However, due to miniaturization trend, the above mentioned low pass filter effects of the chip carrier may arise in printed circuit boards, e.g. in teflon based printed circuit boards. In such cases, stray capacitor effects may be reduced by implementing the invention in the printed circuit board itself.

Naturally, in order to satisfy local and specific requirements, a person skilled in the art may apply to the solution described above many modifications and alterations all of which, however, are included within the scope of protection of the invention as defined by the following claims.

What is claimed is:

1. An electronic device carrier adapted for transmitting high-frequency signal, including a circuitized substrate with a plurality of conductive layers insulated from each other, the conductive layers being arranged in a sequence from a first one of the conductive layers wherein a plurality of signal tracks each one ending with a contact area for transmitting a high-frequency signal are formed, and a reference structure connectable to a reference voltage or ground for shielding the signal tracks,
   characterized in that
   the reference structure includes at least one reference track formed in a second one of the conductive layers adjacent to the first conductive layer and at least one further reference track formed in one of the conductive layers different from the first and second conductive layer, a portion of each signal track excluding at least the area corresponding to the orthographic projection of associated contact area being superimposed in plan view to a corresponding reference track and at least a part of the area corresponding to the orthographic projection of contact area associated to each signal track being superimposed in plan view to a corresponding further reference track with interposition of a floating conductive track not connected to any signal, reference voltage or ground track.

2. The electronic device carrier according to claim 1, wherein at least one intermediate of the conductive layers is arranged between the second conductive layer and said one conductive layer where is formed said further reference track, a plurality of tracks being formed in the at least one intermediate conductive layer, the tracks being arranged in plan view outside a shadow area defined by intersecting a third one of the conductive layers adjacent to the second conductive layer with a surface extending from an outline of the at least one reference track towards the third conductive layer and forming an angle in the range between 30° and 60° with the at least one reference track.

3. The electronic device carrier according to claim 2, wherein said angle is of 45°.

4. The electronic device carrier according to claim 1, wherein the reference structure further includes a plurality of couples of coplanar tracks formed in the first conductive layer, each signal track being arranged between the coplanar tracks of a corresponding couple.

5. The electronic device carrier according to claim 4, further including a plurality of via-holes each one connecting a coplanar track to the corresponding reference track and to the corresponding further reference track.

6. The electronic device carrier of claim 1 wherein said electronic device is a chip.

7. The electronic device carrier according to claim 6, further including a plurality of interconnecting balls each one arranged on a corresponding contact area.

8. A high-frequency electronic device where the electronic device carrier of claim 1, includes a chip of semiconductor material with a plurality of terminals, the chip being mounted on the carrier, and means for electrically connecting each terminal of the chip to the corresponding signal track.

9. The electronic device according to claim 8, wherein terminals of the chip are connected to the corresponding signal tracks by means of interconnecting balls.

10. The electronic device according to claim 8, wherein terminals of the chip are wire bonded to the corresponding signal tracks.

11. The electronic device carrier of claim 1 that comprises a printed circuit board.

12. An electronic device carrier adapted for transmitting high-frequency signal, including a circuitized substrate with a plurality of conductive layers insulated from each other, the conductive layers being arranged in a sequence from a first one of the conductive layers wherein a plurality of signal tracks each one ending with a contact area for transmitting a high-frequency signal are formed, and a reference structure connectable to a reference voltage or ground for shielding the signal tracks,
   characterized in that
   the reference structure includes at least one reference track formed in a second one of the conductive layers adjacent to the first conductive layer and at least one further reference track formed in one of the conductive layers different from the first and second conductive layer, a portion of each signal track excluding at least the area corresponding to the orthographic projection of associated contact area being superimposed in plan view to a corresponding reference track and at least a part of the area corresponding to the orthographic projection of contact area associated to each signal track being superimposed in plan view to a corresponding further reference track with interposition of a floating conductive track not connected to any signal, reference voltage or ground track; and wherein at least one intermediate of the conductive layers is arranged between the second conductive layer and said one conductive layer where is formed said further reference track, a plurality of tracks being formed in the at least one intermediate conductive layer, the tracks being arranged in plan view outside a shadow area defined by intersecting a third one of the conductive layers adjacent to the second conductive layer with a surface extending from an outline of the at least one reference track towards the third conductive layer and forming an angle in the range between 30° and 60° with the at least one reference track; and wherein the reference structure further includes a plurality of couples of coplanar tracks formed in the first conductive layer, each signal track being arranged between the coplanar tracks of a corresponding couple.

13. The electronic device carrier according to claim 12, further including a plurality of via-holes each one connecting a coplanar track to the corresponding reference track and to the corresponding further reference track.

14. The electronic device carrier of claim 12 wherein said electronic device is a chip.

15. The electronic device carrier according to claim 14, further including a plurality of interconnecting balls each one arranged on a corresponding contact area.

16. The electronic device carrier according to claim 13, wherein said angle is of 45°.

17. An electronic device carrier adapted for transmitting high-frequency signal, including a circuitized substrate with a plurality of conductive layers insulated from each other, the conductive layers being arranged in a sequence from a first one of the conductive layers wherein a plurality of signal tracks each one ending with a contact area for transmitting a high-frequency signal are formed, and a reference structure connectable to a reference voltage or ground for shielding the signal tracks, characterized in that the reference structure includes at least one reference track formed in a second one of the conductive layers adjacent to the first conductive layer and at least one further reference track formed in one of the conductive layers different from the first and second conductive layer, a portion of each signal track excluding at least the area corresponding to the orthographic projection of associated contact area being superimposed in plan view to a corresponding reference track and at least a part of the area corresponding to the orthographic projection of contact area associated to each signal track being superimposed in plan view to a corresponding further reference track with interposition of a floating conductive track not connected to any signal, reference voltage or ground track; which includes a chip of semiconductor material with a plurality of terminals, the chip being mounted on the carrier, and means for electrically connecting each terminal of the chip to the corresponding signal track wherein the device carrier consists of a printed circuit board.

18. The electronic device according to claim 17, wherein terminals of the chip are connected to the corresponding signal tracks by means of interconnecting balls.

19. The electronic device according to claim 17, wherein terminals of the chip are wire bonded to the corresponding signal tracks.

* * * * *